(12) United States Patent
Lin et al.

(10) Patent No.: US 7,887,338 B2
(45) Date of Patent: Feb. 15, 2011

(54) GROUND TERMINAL SNAP-FIT INTO A PRINTED CIRCUIT BOARD

(75) Inventors: Chieh-Wei Lin, Taoyuan Hsien (TW); Tsun-Sung Chen, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 173 days.

(21) Appl. No.: 12/352,731

(22) Filed: Jan. 13, 2009

(65) Prior Publication Data

US 2009/0181563 A1   Jul. 16, 2009

(30) Foreign Application Priority Data

Jan. 16, 2008   (TW) .............................. 97101704 A
Sep. 5, 2008   (TW) .............................. 97134200 A

(51) Int. Cl.
*H01R 13/648* (2006.01)
(52) U.S. Cl. ........................................................ 439/92
(58) Field of Classification Search .................. 439/92, 439/567; 361/799
See application file for complete search history.

(56) References Cited

U.S. PATENT DOCUMENTS

| 2,077,120 | A | * | 4/1937 | Lombard | 411/447 |
| 5,024,607 | A | * | 6/1991 | Kachlic | 439/567 |
| 5,437,561 | A | * | 8/1995 | Earl et al. | 439/567 |
| 6,017,226 | A | * | 1/2000 | Jeffries et al. | 439/92 |
| 2005/0079748 | A1 | * | 4/2005 | Kim | 439/92 |

* cited by examiner

*Primary Examiner*—Edwin A. Leon
*Assistant Examiner*—Vanessa Girardi
(74) *Attorney, Agent, or Firm*—Kirton & McConkie; Evan R. Witt

(57) ABSTRACT

A ground terminal is mounted on a circuit board. The circuit board has a through-hole. The ground terminal includes a main body, a tail part and an insertion part. The tail part is connected to the main body. The insertion part is extended downwardly from the tail part and aligned with the through-hole of the circuit board, and has a hooking element. After the insertion part is penetrated through the through-hole, the hooking element is sustained against a lower surface of the circuit board so as to facilitate fixing the ground terminal onto the circuit board.

13 Claims, 12 Drawing Sheets

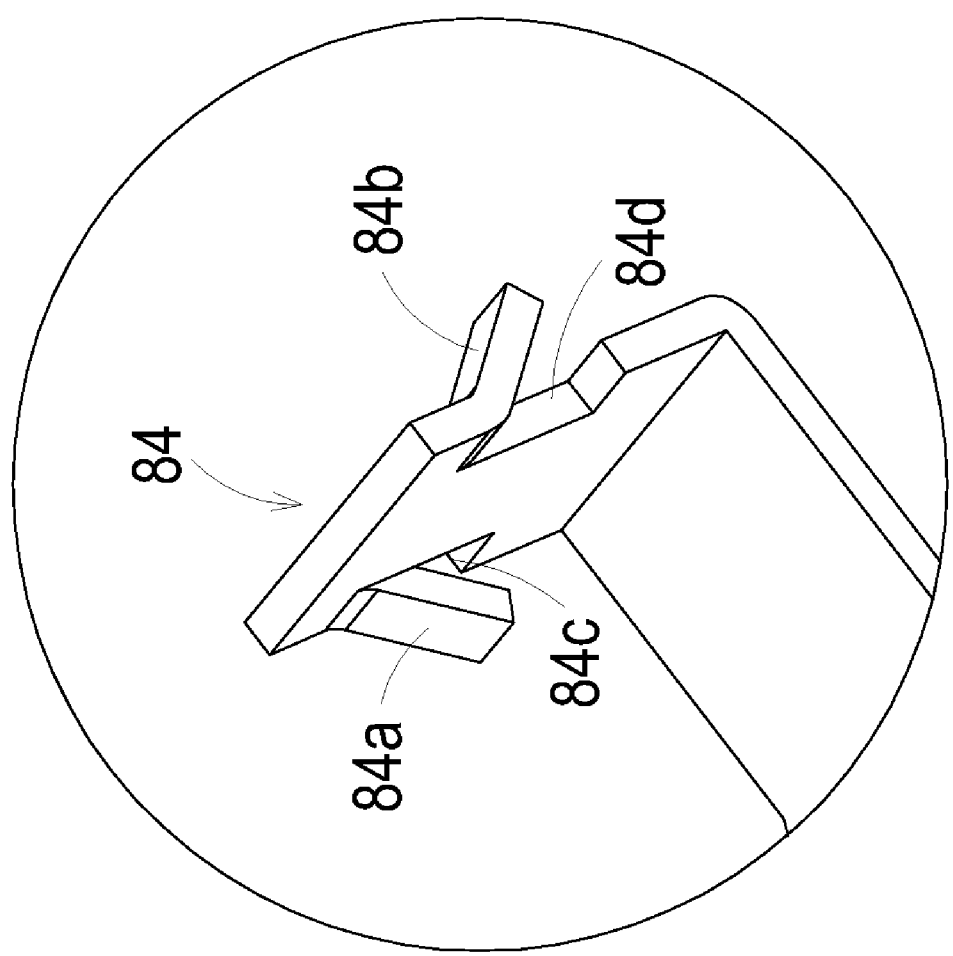

US 7,887,338 B2

GROUND TERMINAL SNAP-FIT INTO A PRINTED CIRCUIT BOARD

FIELD OF THE INVENTION

The present invention relates to a ground terminal, and more particularly to a ground terminal mounted on a circuit board.

BACKGROUND OF THE INVENTION

During an electronic appliance is assembled, a ground wire of a circuit board is connected to a metallic frame of the electronic appliance through a ground terminal in order to discharge electricity to the ground. FIG. 1 is a schematic perspective view illustrating a ground terminal for connecting a circuit board and a metallic frame according to the prior art. As shown in FIG. 1, the ground terminal 2 principally comprises a connecting part 2a, and several conducting parts 2b, 2c and 2d. In addition, a perforation 2e is formed in the connecting part 2a.

Hereinafter, the process of mounting the ground terminal 2 on the circuit board 1 will be illustrated with reference to FIGS. 1 and 2.

First of all, the conducting parts 2b, 2c and 2d of the ground terminal 2 are inserted into corresponding through-holes 1a of the circuit board 1. Then, by applying soldering paste (not shown) onto the junctions between the ground terminal 2 and the circuit board 1, the ground terminal 2 is welded onto the circuit board 1 and connected to the ground wire (not shown) of the circuit board 1. Then, the connecting part 2a of the ground terminal 2 is bent toward the upper surface 1c of the circuit board 1. As such, the connecting part 2a lies flat on the upper surface 1c of the circuit board 1, and the perforation 2e of the ground terminal 2 is aligned with another perforation 1b of the circuit board 1. Meanwhile, the ground terminal 2 is integrated into the circuit board 1, as can be seen in FIG. 2. Then, a metallic frame 10 having a bolt hole 10a is placed under the circuit board 1. After a screw 11 is successively penetrated through the perforation 2e of the ground terminal 2 and the perforation 1b of the circuit board 1, the screw 11 is screwed in the bolt hole 10a of the metallic frame 10. Meanwhile, the ground terminal 2 and the circuit board 1 are fixed on the metallic frame 10.

Through the screw 11, the ground terminal 2 and the circuit board 1 are fixed on the metallic frame 10. In addition, through the screw 11, the ground terminal 2, the ground wire of the circuit board 1 and the metallic frame 10 are electrically connected to each other in order to discharge electricity to the ground.

The assembly of the ground terminal 2, the circuit board 1 and the metallic frame 10, however, still has some drawbacks. For example, during this assembly is heated in a reflow furnace to perform the soldering process, the conducting parts 2b, 2c and 2d of the ground terminal 2 are readily raised. Under this circumstance, the conducting parts 2b, 2c and 2d of the ground terminal 2 possibly fail to be electrically connected with the ground wire on the lower surface 1d of the circuit board 1. Moreover, since no positioning structure is arranged between the perforation 2e of the ground terminal 2 and the perforation 1b of the circuit board 1, the ground terminal 2 is readily shifted toward the bilateral sides during the screw 11 is penetrated through the perforations 2e and 1b. Moreover, since the perforations 2e and 1b are not engaged with each other, the perforation 2e is possibly shifted or aslant after the ground terminal 2 is welded onto the circuit board 1. Under this circumstance, the perforation 2e of the ground terminal 2 and the perforation 1b are no longer aligned with each other, and thus the screw 11 fails to fasten the assembly of the ground terminal 2, the circuit board 1 and the metallic frame 10. On the other hand, since the distance between every two adjacent conducting parts 2b, 2c and 2d is very short and the distance between any through-hole 1a and the perforation 1b of the circuit board 1 is relatively short, the circuit board 1 is readily cracked along the cracked line A and/or the conducting parts 2b, 2c and 2d of the ground terminal 2 are readily broken if the external force for penetrating the screw 11 through the ground terminal 2, the circuit board 1 and the metallic frame 10 is improper. The damage of the circuit board 1 and/or the ground terminal 2 is advantageous for assembling the ground terminal 2, the circuit board 1 and the metallic frame 10.

Therefore, there is a need of providing an improved ground terminal so as to obviate the drawbacks encountered from the prior art.

SUMMARY OF THE INVENTION

It is an object of the present invention to provide a ground terminal mounted on a circuit board to prevent the ground terminal from being raised during the ground terminal and the circuit board are heated in a reflow furnace.

Another object of the present invention provides a ground terminal mounted on a circuit board so as to prevent damage of the circuit board and/or the ground terminal.

A further object of the present invention provides a ground terminal that can be securely mounted on a circuit board.

In accordance with an aspect of the present invention, there is provided a ground terminal mounted on a circuit board. The circuit board has a through-hole. The ground terminal includes a main body, a tail part and an insertion part. The tail part is connected to the main body. The insertion part is extended downwardly from the tail part and aligned with the through-hole of the circuit board, and has a hooking element. After the insertion part is penetrated through the through-hole, the hooking element is sustained against a lower surface of the circuit board so as to facilitate fixing the ground terminal onto the circuit board.

The above contents of the present invention will become more readily apparent to those ordinarily skilled in the art after reviewing the following detailed description and accompanying drawings, in which:

BRIEF DESCRIPTION OF THE DRAWINGS

FIG. 6B is a partially schematic enlarged view illustrating the ground terminal shown in FIG. 6A;

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
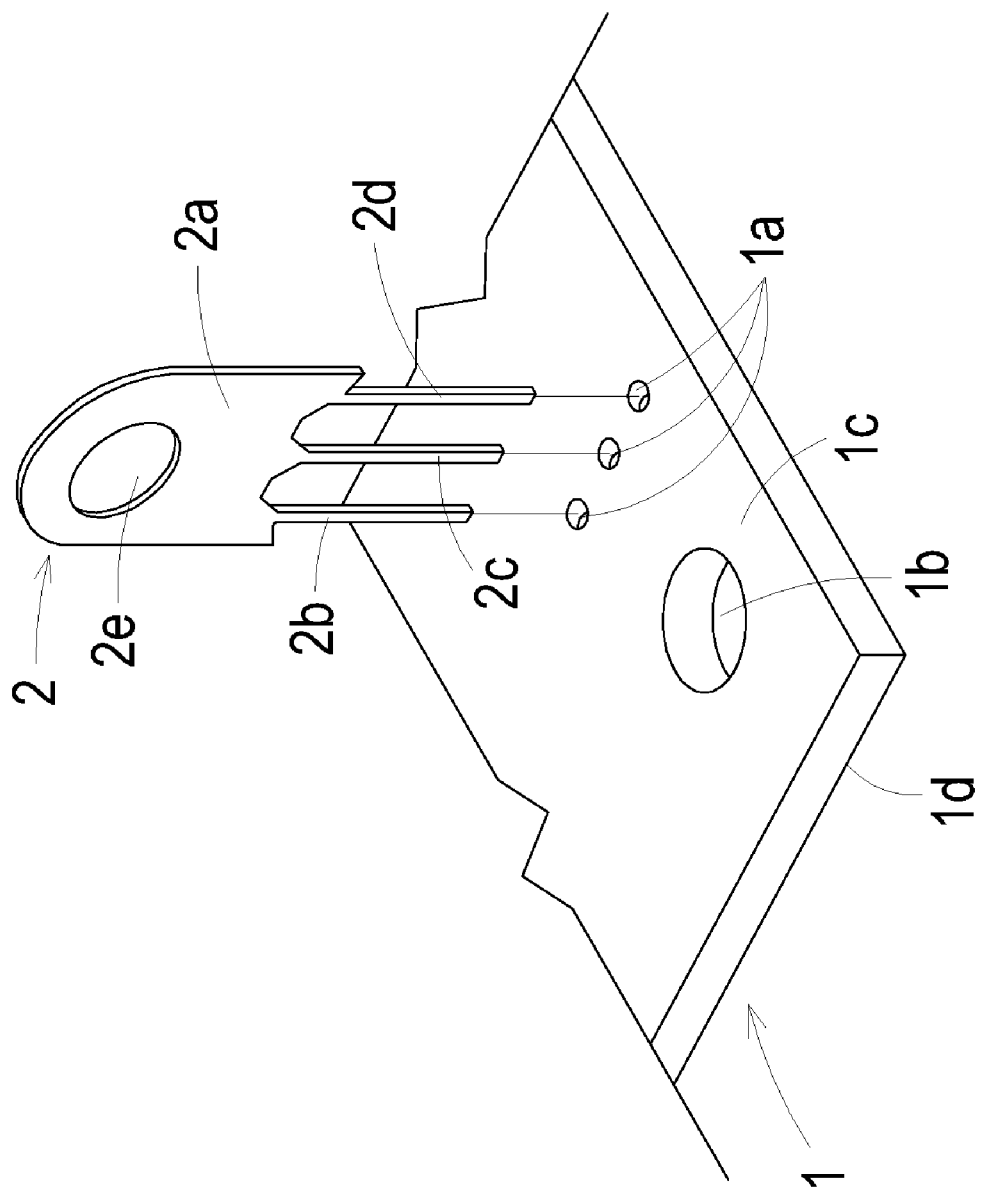
FIG. 1 is a schematic perspective view illustrating a ground terminal for connecting a circuit board and a metallic frame according to the prior art.
Figure 2:
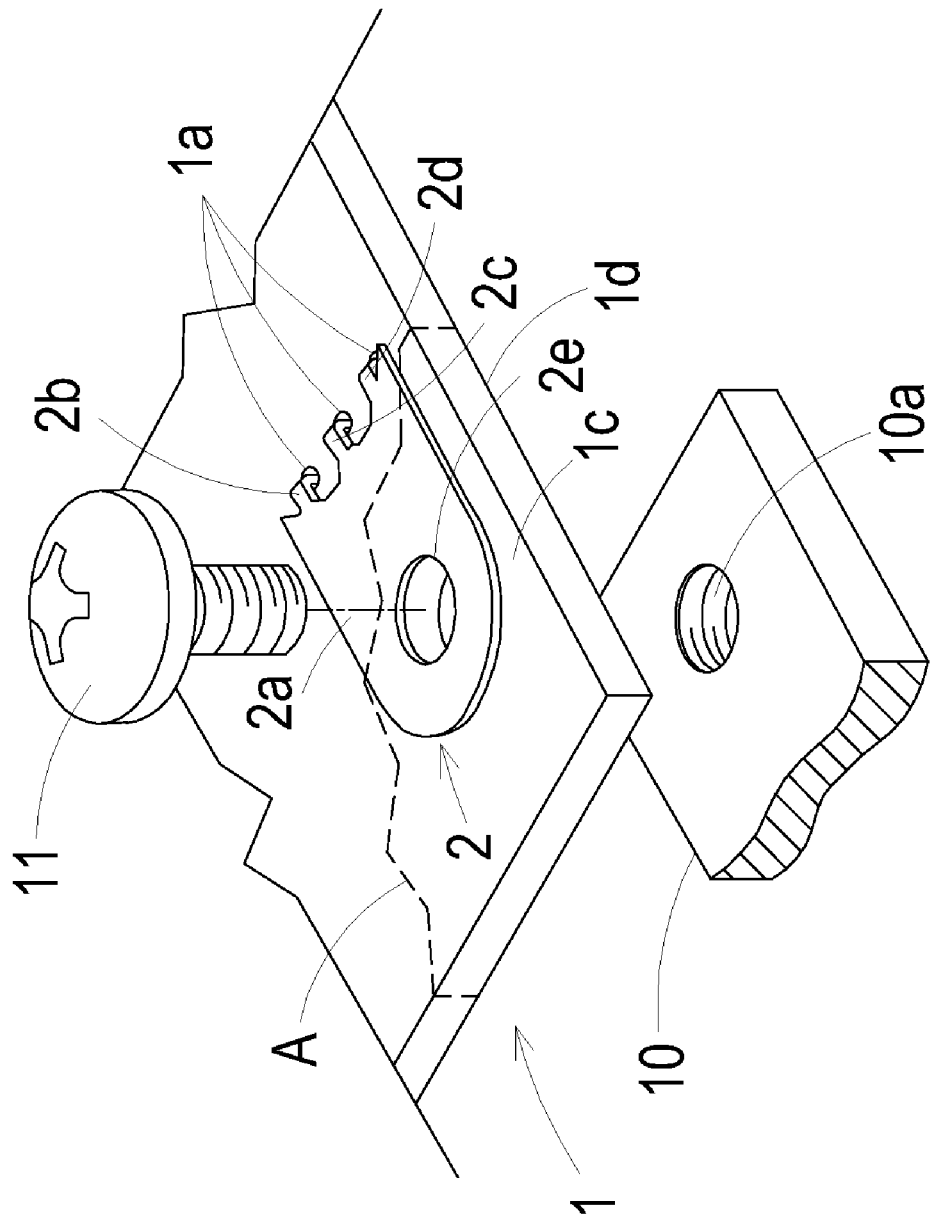
FIG. 2 schematically illustrates the ground terminal integrated into a circuit board.
Figure 3A:
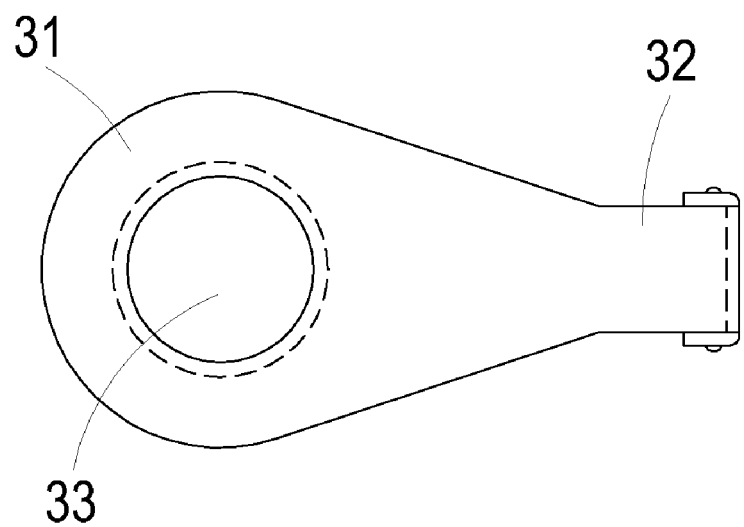
FIG. 3A is a schematic top view illustrating a ground terminal according to a first preferred embodiment of the present invention.
Figure 3B:
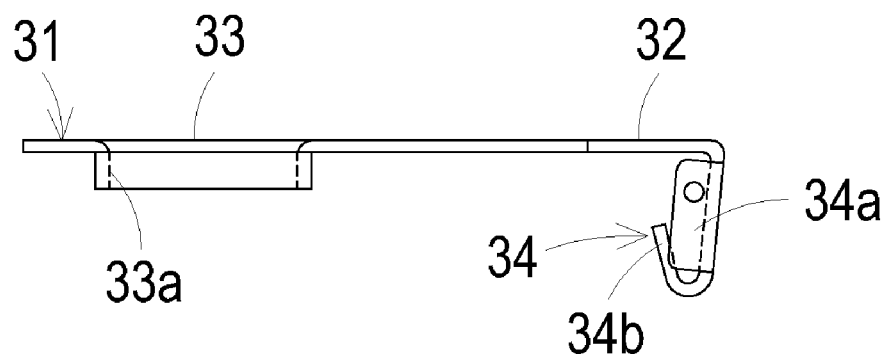
FIG. 3B is a schematic side view of the ground terminal shown in FIG. 3A.

FIGS. 3A and 3B are respectively schematic top and side views illustrating a ground terminal according to a first preferred embodiment of the present invention. As shown in FIGS. 3A and 3B, the ground terminal 3 principally comprises a main body 31 and a tail part 32. The tail part 32 is connected to the main body 31. It is preferred that the tail part 32 is integrally formed with the main body 31. In addition, at least an insertion part 34 is extended downwardly from the tail part 32. The insertion part 34 is connected to a ground wire (not shown) of a circuit board. The insertion part 34 comprises at least a hooking element 34b. After the insertion part 34 is penetrated through a through-hole 41 of the circuit board 4 (as shown in FIG. 4B), the hooking element 34b of the insertion part 34 is sustained against the lower surface 43 of the circuit board 4 and the main body 31 of the ground terminal 3 is arranged on the upper surface of the circuit board 4. As such, the ground terminal 3 is fixed on the circuit board 4.

In this embodiment, the ground terminal 3 is made of conductive material such as metallic material. The main body 31 may have arbitrary shape and profile. It is preferred that the main body 31 has an arc-shaped profile. In some embodiments, the width of the main body 31 is larger than the width of the tail part 32. In this embodiment, the ground terminal 3 is tapered from the main body 31 to the tail part 32. The main body 31 has a central opening 33, which has a circular shape. A coupling part 33a is protruded downwardly from the periphery of the opening 33. It is preferred that the coupling part 33a is integrally formed with the main body 31.

The insertion part 34 is extended downwardly from the end of the tail part 32. The insertion part 34 has two lateral plates 34a and at least a hooking element 34b. The two lateral plates 34a are disposed on opposite sides of the hooking element 34b. An example of the hooking element 34b includes but is not limited to a hook. The free end of the hooking element 34b is extended toward the main body 31 or the tail part 32 such that a gap is between the free end of the hooking element 34b and the main body 31 or the tail part 32.

Figure 4A:
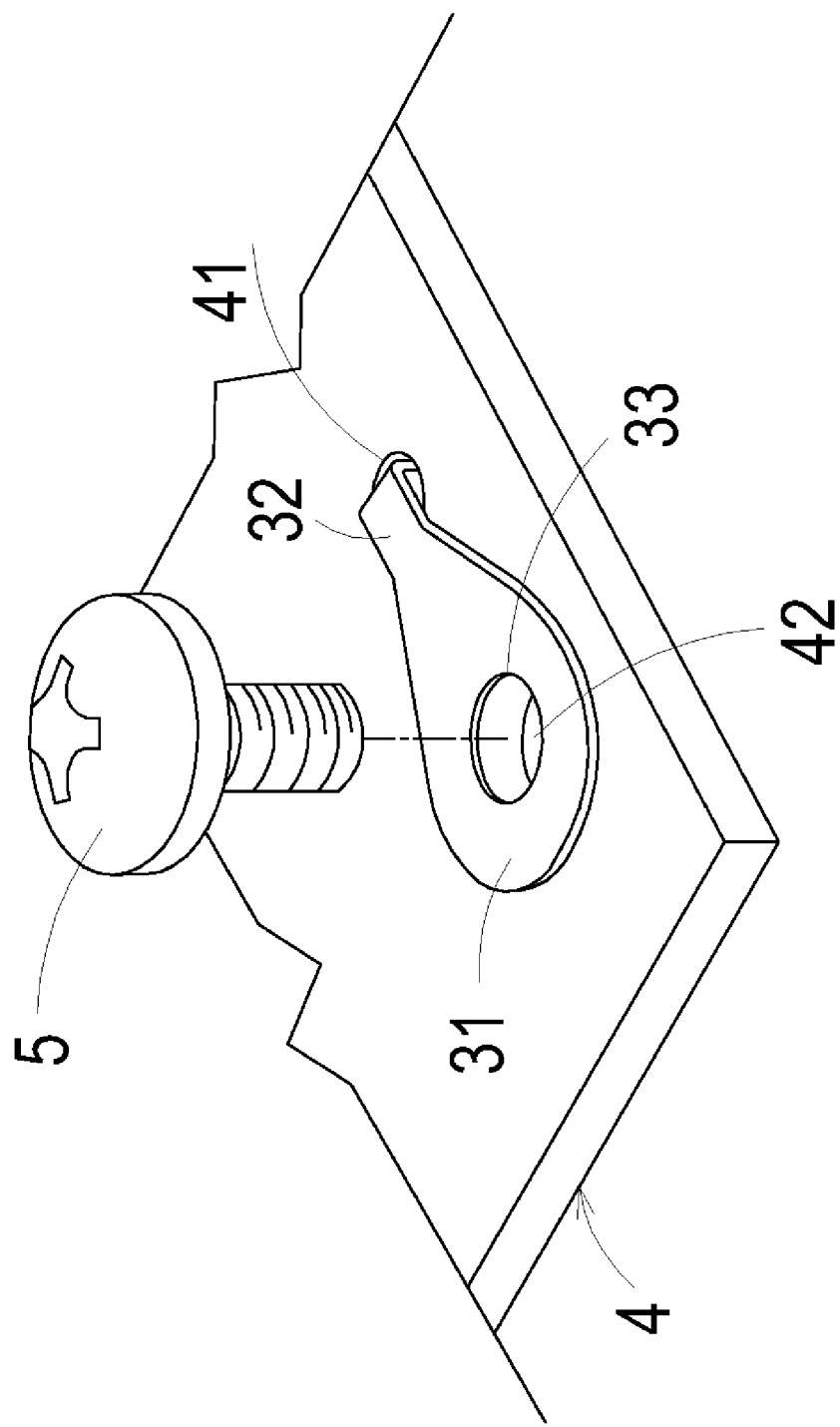
FIG. 4A is a schematic perspective illustrating the ground terminal of FIG. 3 to be mounted on a circuit board.
Figure 4B:
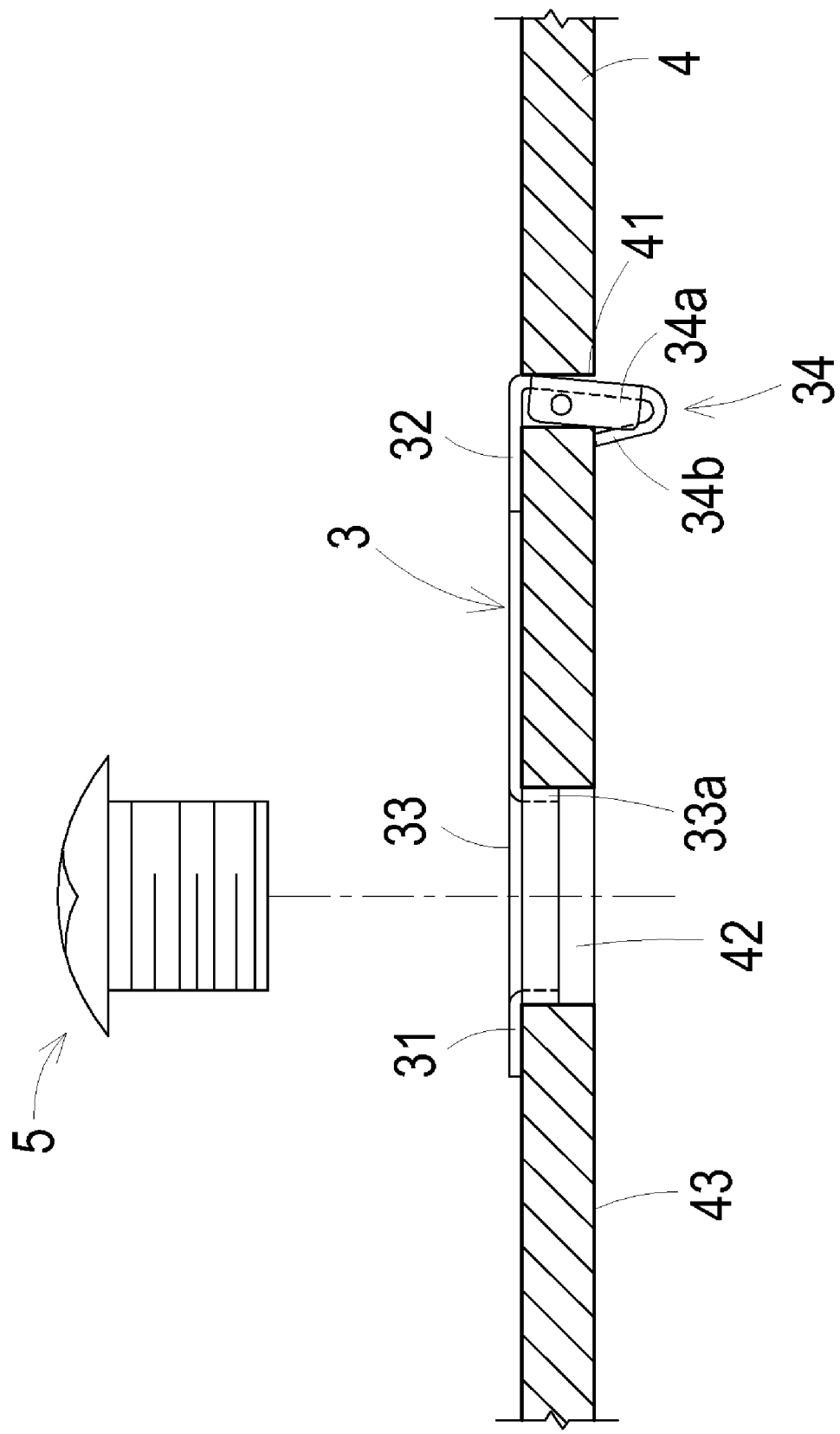
FIG. 4B is a schematic cross-sectional view of the ground terminal and the circuit board shown in FIG. 4A.

FIGS. 4A and 4B are respectively schematic perspective and cross-sectional views illustrating the ground terminal of FIG. 3 to be mounted on a circuit board according to the present invention. The circuit board 4 is for example a printed circuit board. The circuit board 4 has at least a through-hole 41 and a perforation 42. Hereinafter, the process of mounting the ground terminal 3 on the circuit board 4 will be illustrated with reference to FIGS. 4A and 4B.

First of all, the main body 31 of the ground terminal 3 is placed on the upper surface of the circuit board 4 while the insertion part 34 is inserted into the through-hole 41 of the circuit board 4. Since the hooking element 34b of the insertion part 34 is resilient, the hooking element 34b is compressed by the sidewall of the through-hole 41 during the insertion part 34 is inserted in the through-hole 41. After the hooking element 34b is completely penetrated through the through-hole 41, the compressed hooking element 34b is restored due to the elastic force thereof, so that the hooking element 34b of the insertion part 34 is sustained against the lower surface 43 of the circuit board 4. As a consequence, the ground terminal 3 is firmly integrated into the circuit board 4 and electrically connected to the ground wire (not shown) of the circuit board 4. Moreover, the two lateral plates 34a of the insertion part 34 are sustained against the sidewall of the through-hole 41, thereby facilitating further fixing the insertion part 34. In other words, the ground terminal 3 and the circuit board 4 are securely combined together by means of the hooking element 34b and the lateral plates 34a. As a consequence, during the combination of the ground terminal 3 and the circuit board 4 is heated in a reflow furnace to perform the soldering process, the tail part 32 of the ground terminal 3 will not be raised and the drawbacks encountered from the prior art will be overcome.

Furthermore, the opening 33 of the main body 31 of the ground terminal 3 is aligned with the perforation 42 of the circuit board 4. The coupling part 33a, which is downwardly protruded from the periphery of the opening 33, is embedded into the perforation 42 and sustained against the sidewall of the perforation 42. After a fastening element 5 (e.g. a screw) is successively penetrated through the opening 33 of the ground terminal 3 and the perforation 42 of the circuit board 4, the fastening element 5 is screwed in a bolt hole of a metallic frame (not shown). Meanwhile, the ground terminal 3 and the circuit board 4 are fixed on the metallic frame. Since the coupling part 33a of the ground terminal 3 is tight-fitted into the perforation 42 of the circuit board 4, the ground terminal 3 will be no longer shifted toward the bilateral sides during the fastening element 5 is penetrated through the opening 33 and the perforation 42. Moreover, since the coupling part 33a of the ground terminal 3 is tight-fitted into the perforation 42 of the circuit board 4, the ground terminal 3 will not be raised during the combination of the ground terminal 3 and the circuit board 4 is heated in a reflow furnace to perform the soldering process. Under this circumstance, the opening 33 of the ground terminal 3 and the perforation 42 of the circuit board 4 are precisely aligned with each other, so that the fastening element 5 can be smoothly penetrated through the opening 33 of the ground terminal 3 and the perforation 42 of the circuit board 4.

Figure 5A:
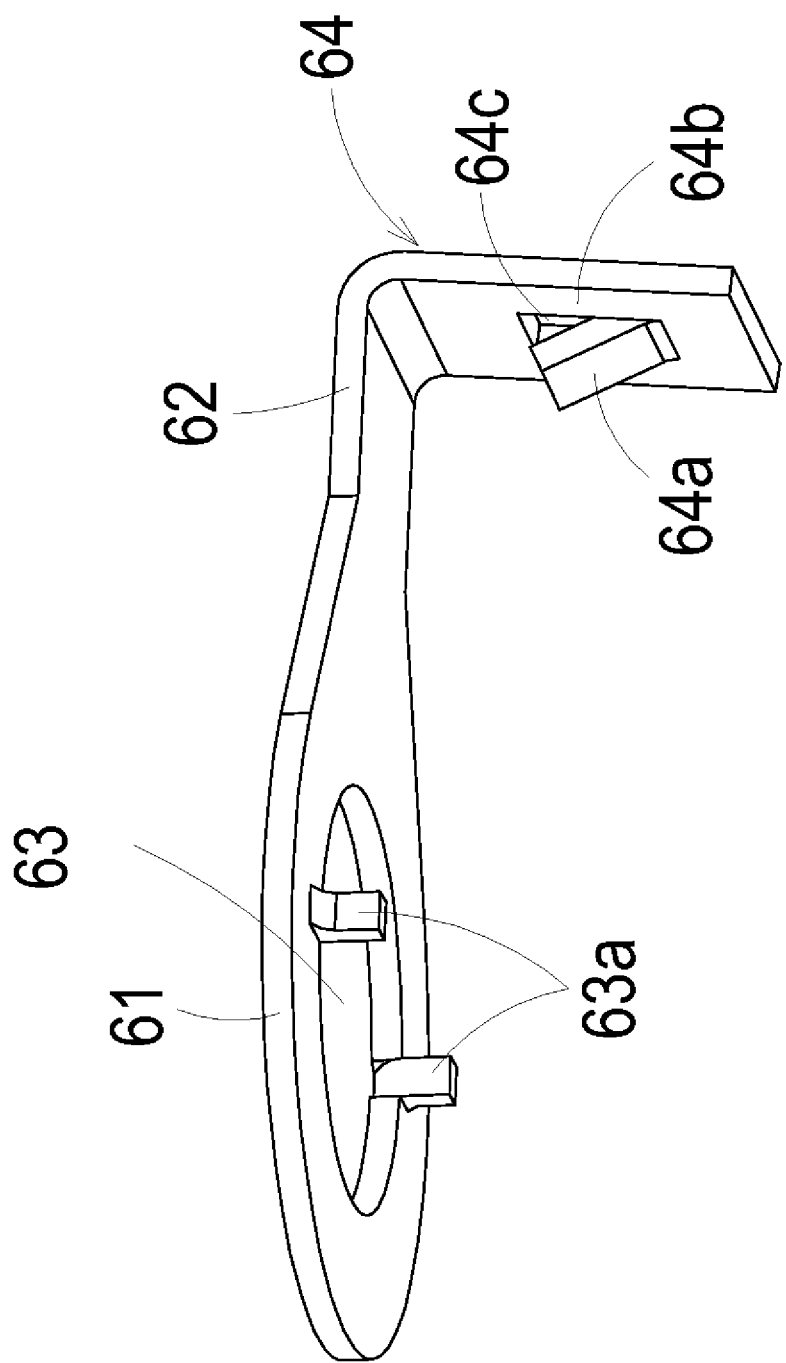
FIG. 5A is a schematic perspective view of a ground terminal according to a second preferred embodiment of the present invention.
Figure 5B:
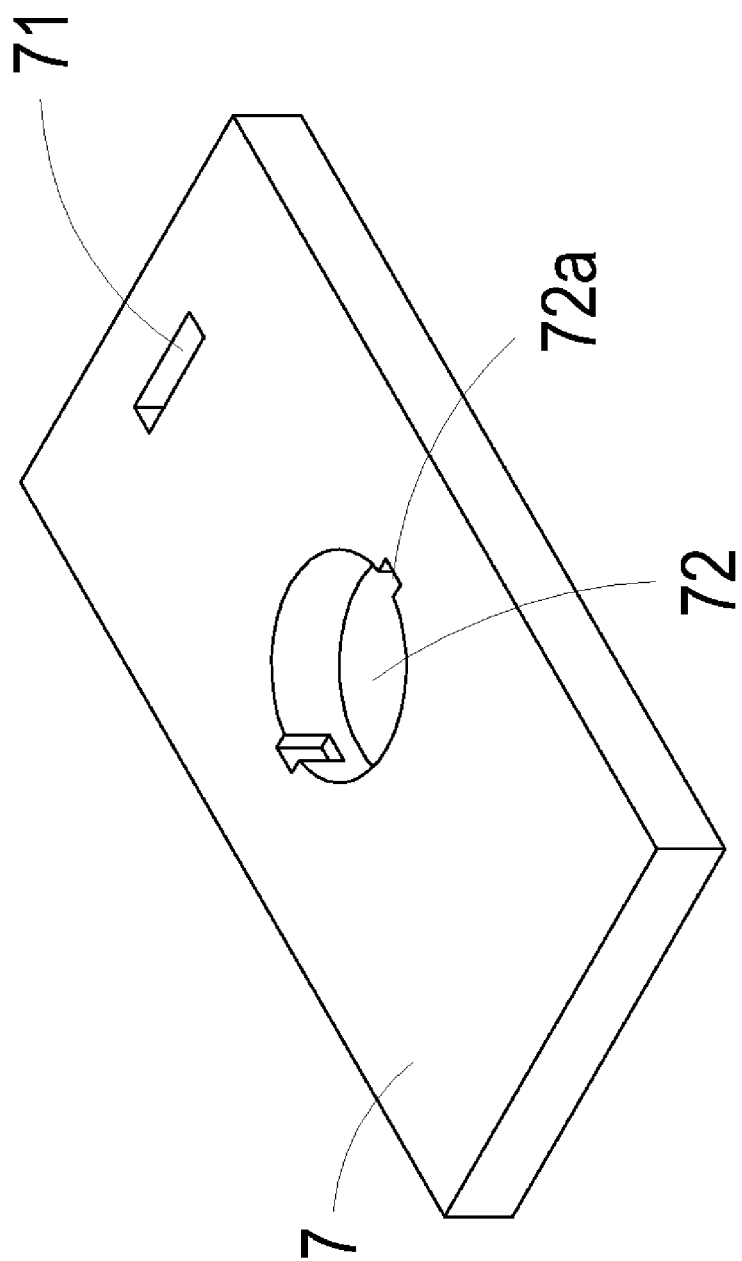
FIG. 5B is a schematic perspective view illustrating a circuit board to be coupled with the ground terminal of FIG. 5A.

FIG. 5A is a schematic perspective view of a ground terminal according to a second preferred embodiment of the present invention. FIG. 5B is a schematic perspective view illustrating a circuit board to be coupled with the ground terminal of FIG. 5A. As shown in FIG. 5A, the ground terminal 6 principally comprises a main body 61 and a tail part 62. The configurations, the material and the connecting means of the main body 61 and the tail part 62 are identical to those of the main body 31 and the tail part 32 shown in FIG. 3, and are not redundantly described herein. Similarly, the main body 61 has a central opening 63. A coupling part is protruded downwardly from the periphery of the opening 63. It is preferred that the coupling part is integrally formed with the main body 61. In this embodiment, the coupling part includes two first engaging elements 63a. As shown in FIG. 5B, the circuit board 7 is for example a printed circuit board. The circuit board 7 has a through-hole 71 and a perforation 72. Correspondingly to the two first engaging elements, the circuit board 7 has two second engaging elements 72a such that the first engaging elements 63a and the second engaging elements 72a can be engaged with each other. In this embodiment, the first engaging elements are flexible slices protruded downwardly from the periphery of the opening 63, and the second engaging elements 72a are recesses formed in the sidewall of the perforation 72 of the circuit board 7. When the first engaging elements 63a are engaged with the second engaging elements 72a, the opening 63 of the ground terminal 6 and the perforation 72 of the circuit board 7 are precisely aligned with each other.

Figure 5C:
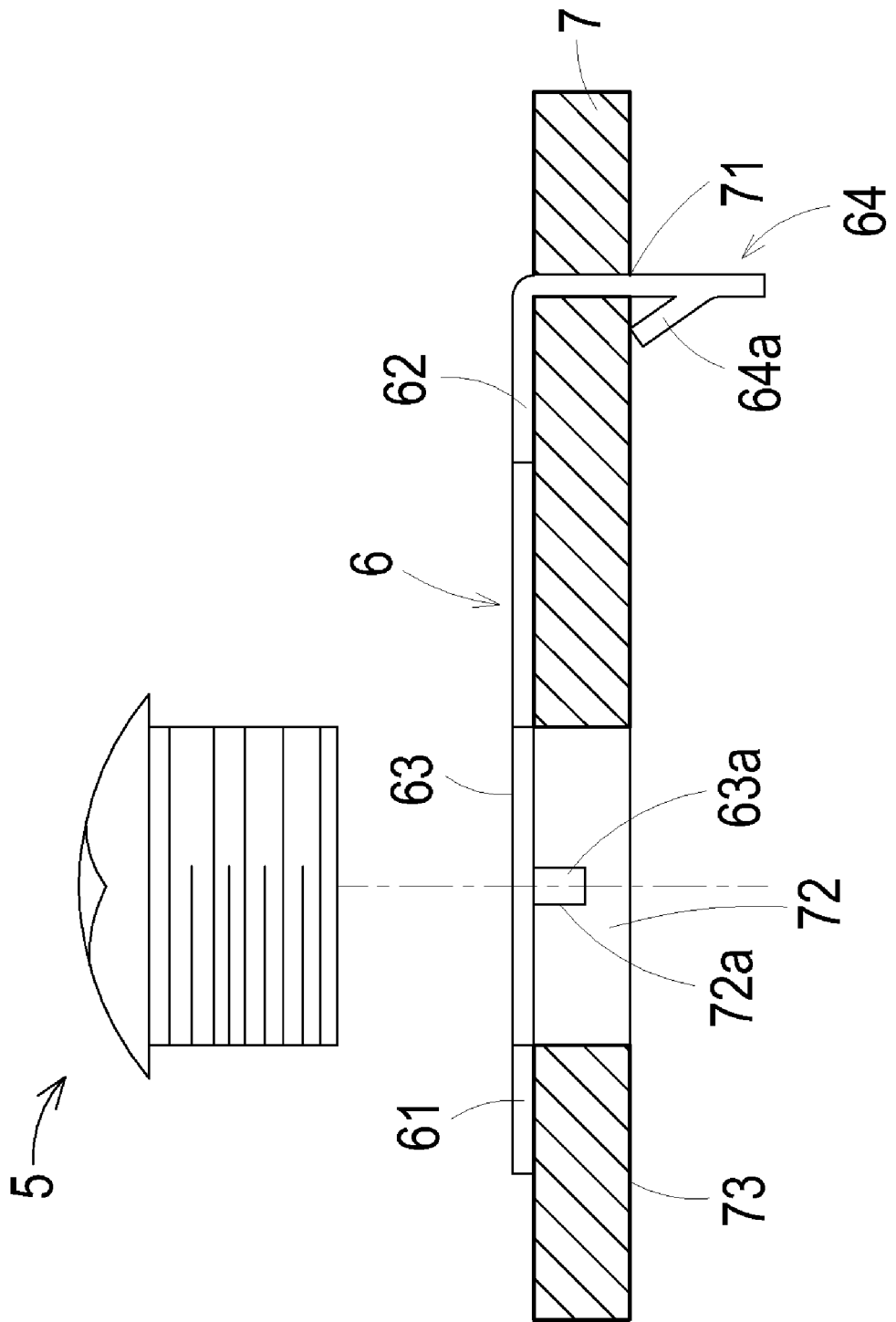
FIG. 5C is a schematic cross-sectional view illustrating the ground terminal of FIG. 5A mounted on a circuit board.

Please refer to FIG. 5A again. An insertion part 64 is extended downwardly from an end of the tail part 62. A hooking element 64a is protruded from a surface 64b of the insertion part 64 facing the main body 61. In addition, an indentation 64c is formed in the surface 64b of the insertion part 64 and adjacent to the hooking element 64a. In a case that the hooking element 64a is compressed by the sidewall of the through-hole 71 of the circuit board (as shown in FIG. 5B), the hooking element 64a will be received in the indentation 64c. An example of the hooking element 64a includes but is not limited to a single-sided hook, which is integrally formed with the insertion part 64. The free end of the hooking element 64a is extended toward the main body 61 or the tail part 62 such that a gap is between the free end of the hooking element 64a and the main body 61 or the tail part 62. After the insertion part 64 is penetrated through a through-hole 71 of the circuit board 7 (as shown in FIGS. 5B and 5C), the hooking element 64a of the insertion part 64 is sustained against the lower surface 73 of the circuit board 7 and the main body 61 of the ground terminal 6 is arranged on the upper surface of the circuit board 7. As such, the ground terminal 6 is fixed on the circuit board 7.

FIG. 5C is a schematic cross-sectional view illustrating the ground terminal of FIG. 5A mounted on a circuit board according to the present invention. Hereinafter, the process of mounting the ground terminal 6 on the circuit board 7 will be illustrated with reference to FIGS. 5A, 5B and 5C. First of all, the main body 61 of the ground terminal 6 is placed on the upper surface of the circuit board 7 while the insertion part 64 is inserted into the through-hole 71 of the circuit board 7. Since the hooking element 64a of the insertion part 64 is resilient and the indentation 64c is formed beside the hooking element 64a, the hooking element 64a is compressed by the sidewall of the through-hole 71 and received in the indentation 64c during the insertion part 64 is inserted in the through-hole 71. After the insertion part 64 is completely penetrated through the through-hole 71, the compressed hooking element 64a is returned to its original position due to the elastic force thereof, so that the hooking element 64a of the insertion part 64 is sustained against the lower surface 73 of the circuit board 7. As a consequence, the ground terminal 6 is firmly integrated into the circuit board 7 and electrically connected to the ground wire (not shown) of the circuit board 7. In other words, the ground terminal 6 and the circuit board 7 are securely combined together by means of the hooking element 64a of the insertion part 64. As a consequence, during the combination of the ground terminal 6 and the circuit board 7 is heated in a reflow furnace to perform the soldering process, the tail part 62 of the ground terminal 6 will not be raised and the drawbacks encountered from the prior art will be overcome.

Furthermore, the opening 63 of the main body 61 of the ground terminal 6 is aligned with the perforation 72 of the circuit board 7. The first engaging elements 63a of the coupling part, which are downwardly protruded from the periphery of the opening 63, are engaged with the second engaging elements 72a (e.g. recesses) formed in the sidewall of the perforation 72 of the circuit board 7. After a fastening element 5 (e.g. a screw) is successively penetrated through the opening 63 of the ground terminal 6 and the perforation 72 of the circuit board 7, the fastening element 5 is screwed in a bolt hole of a metallic frame (not shown). Meanwhile, the ground terminal 6 and the circuit board 7 are fixed on the metallic frame. Since the first engaging elements 63a of the coupling part are engaged with the second engaging elements 72a (e.g. recesses) of the perforation 72 of the circuit board 7, the ground terminal 6 will be no longer shifted toward the bilateral sides during the fastening element 5 is penetrated through the opening 63 and the perforation 72. Moreover, since the first engaging elements 63a of the coupling part are engaged with the second engaging elements 72a (e.g. recesses) of the perforation 72 of the circuit board 7, the ground terminal 6 will not be raised during the combination of the ground terminal 6 and the circuit board 7 is heated in a reflow furnace to perform the soldering process. Under this circumstance, the opening 63 of the ground terminal 6 and the perforation 72 of the circuit board 7 are precisely aligned with each other, so that the fastening element 5 can be smoothly penetrated through the opening 63 of the ground terminal 6 and the perforation 72 of the circuit board 7.

Figure 6A:
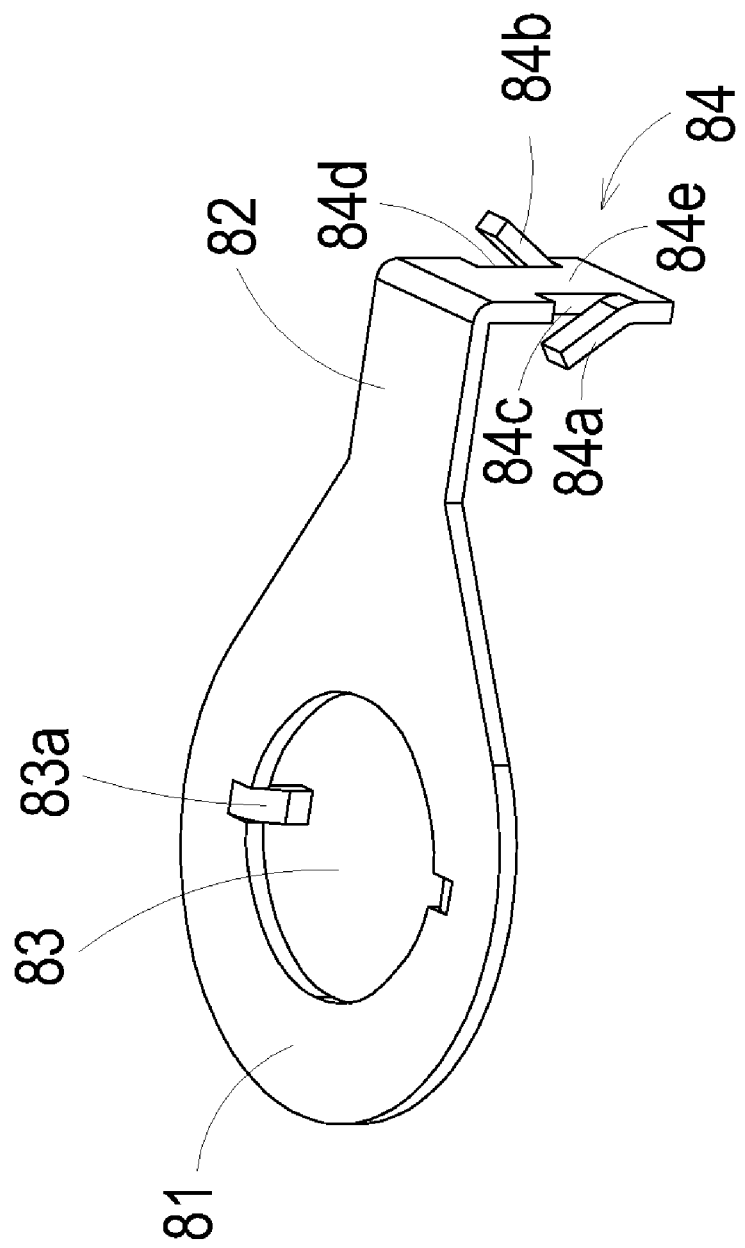
FIG. 6A is a schematic perspective view of a ground terminal according to a third preferred embodiment of the present invention.
Figure 6C:
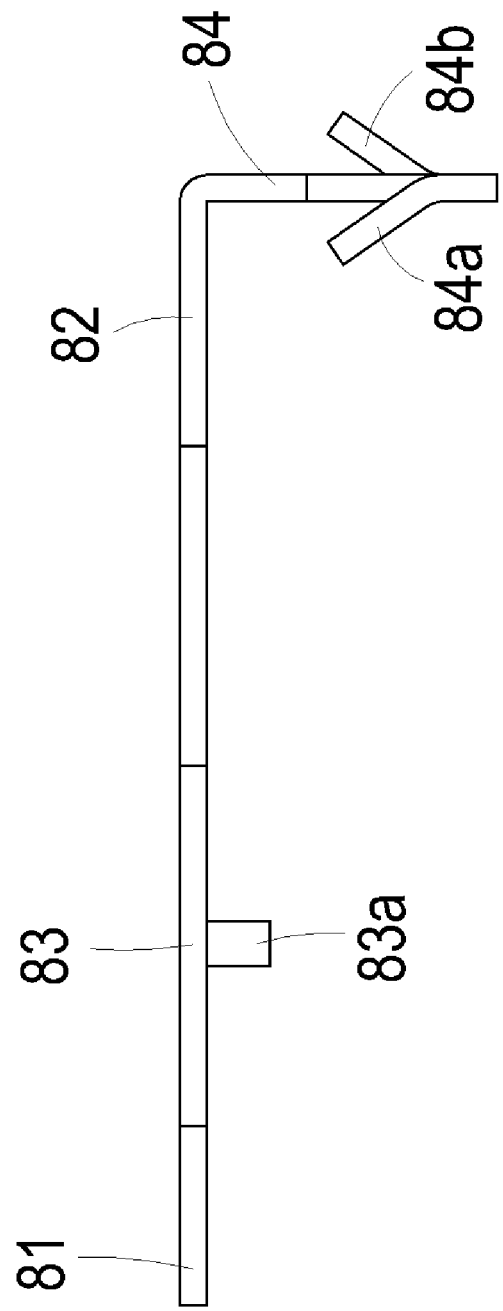
FIG. 6C is a schematic side view illustrating the ground terminal shown in FIG. 6A.

FIG. 6A is a schematic perspective view of a ground terminal according to a third preferred embodiment of the present invention. FIG. 6B is a partially schematic enlarged view illustrating the ground terminal shown in FIG. 6A. FIG. 6C is a schematic side view illustrating the ground terminal shown in FIG. 6A. The ground terminal 8 principally comprises a main body 81 and a tail part 82. The configurations, the material and the connecting means of the main body 81 and the tail part 82 are identical to those of the main body 31 and the tail part 32 shown in FIG. 3, and are not redundantly described herein. An insertion part 84 is extended downwardly from an end of the tail part 82. In addition, two hooking elements 84a and 84b are protruded from a surface 84e of the insertion part 84 in opposite directions. Two notches 84c and 84d are formed beside the hooking elements 84a and 84b, respectively. In a case that the hooking elements 84a and 84b are respectively compressed by the sidewall of the through-hole 71 of the circuit board 7, the hooking elements 84a and 84b will be received in the notches 84c and 84d. The free end of the hooking element 84a is extended toward the main body 81 or the tail part 82 such that a gap is between the free end of the hooking element 84a and the main body 81 or the tail part 82. The free end of the hooking element 84b is extended in a direction opposite to the hooking element 84a. As such, the hooking elements 84a and 84b are collectively formed as a double-sided hook. Since the hooking elements 84a and 84b of the insertion part 84 are resilient and the notches 84c and 84d are respectively formed beside the hooking elements 84a and 84b, the hooking elements 84a and 84b are compressed by the sidewall of the through-hole 71 and received in the notches 84c and 84d during the insertion part 84 is inserted in the through-hole 71. Since the hooking elements 84a and 84b are sustained against two positions of the lower surface 73 of the circuit board 7, the ground terminal 8 is more securely fixed on the circuit board 7 and a firm connection between the ground terminal 8 and the circuit board 7 is rendered.

Figure 6D:
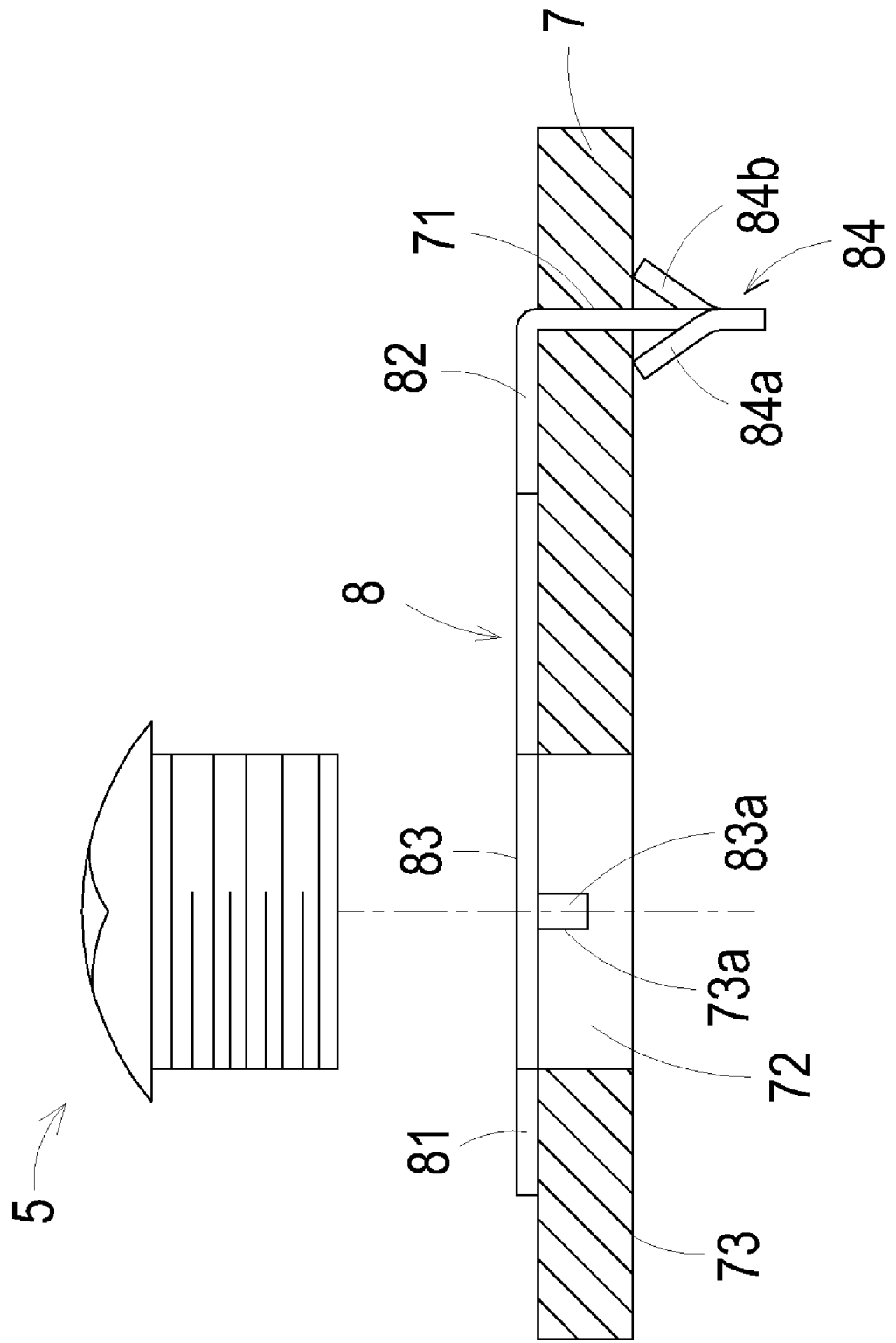
FIG. 6D is a schematic cross-sectional view illustrating the ground terminal of FIG. 6A mounted on a circuit board.

FIG. 6D is a schematic cross-sectional view illustrating the ground terminal of FIG. 6A mounted on a circuit board according to the present invention. As shown in FIG. 6D, the circuit board 7 is for example a printed circuit board and comprises a through-hole 71 and a perforation 72. Hereinafter, the process of mounting the ground terminal 8 on the circuit board 7 will be illustrated with reference to FIGS. 5A, 5B, 5C and 5D.

First of all, the main body 81 of the ground terminal 8 is placed on the upper surface of the circuit board 7 while the insertion part 84 is inserted into the through-hole 71 of the circuit board 7. Since the hooking elements 84a and 84b are resilient and the notches 84c and 84d are respectively formed beside the hooking elements 84a and 84b, the hooking elements 84a and 84b are compressed by the sidewall of the through-hole 71 and received in the notches 84c and 84d during the insertion part 84 is inserted in the through-hole 71. After the insertion part 84 is completely penetrated through the through-hole 71, the compressed hooking elements 84a and 84b are returned to their original positions due to the elastic force thereof, so that the hooking elements 84a and 84b of the insertion part 84 are sustained against the lower surface 73 of the circuit board 7. As a consequence, the ground terminal 8 is firmly integrated into the circuit board 7 and electrically connected to the ground wire (not shown) of the circuit board 7. In other words, the ground terminal 8 and the circuit board 7 are securely combined together by means of the hooking elements 84a and 84b of the insertion part 84. As a consequence, during the combination of the ground terminal 8 and the circuit board 7 is heated in a reflow furnace to perform the soldering process, the tail part 82 of the ground terminal 8 will not be raised and the drawbacks encountered from the prior art will be overcome.

Furthermore, the opening 83 of the main body 81 of the ground terminal 8 is aligned with the perforation 72 of the circuit board 7. The first engaging elements 83a of the coupling part, which are downwardly protruded from the periphery of the opening 83, are engaged with the second engaging elements 72a (e.g. recesses) formed in the sidewall of the perforation 72 of the circuit board 7. After a fastening element 5 (e.g. a screw) is successively penetrated through the opening 83 of the ground terminal 8 and the perforation 72 of the circuit board 7, the fastening element 5 is screwed in a bolt hole of a metallic frame (not shown). Meanwhile, the ground terminal 8 and the circuit board 7 are fixed on the metallic frame.

From the above description, by means of the coupling part and the hooking element of the insertion part, the ground terminal of the present invention can be securely fixed on the circuit board. As a consequence, during the combination of the ground terminal and the circuit board is heated in a reflow furnace to perform the soldering process, the tail part of the ground terminal will not be raised and the drawbacks encountered from the prior art will be overcome. Since the coupling part of the ground terminal is tight-fitted into the perforation of the circuit board, the ground terminal will be no longer shifted toward the bilateral sides during the fastening element is penetrated through the opening and the perforation of the main body. In addition, the problem of causing damage of the ground terminal and/or the circuit board will be solved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A ground terminal mounted on a circuit board, said circuit board has a through-hole and a perforation, said ground terminal comprising:
   a main body comprising an opening and a coupling part including two flexible slices protruded downwardly from a periphery of said opening;
   a tail part connected to said main body; and
   an insertion part extended downwardly from said tail part, aligned with said through-hole of said circuit board, and having a hooking element, wherein after said insertion part is penetrated through said through-hole, said hooking element is sustained against a lower surface of said circuit board so as to facilitate fixing said ground terminal onto said circuit board, and said flexible slices are respectively engaged with two recesses formed in the sidewall of said perforation of said circuit board to facilitate fixing said main body on said circuit board.

2. The ground terminal according to claim 1 wherein said circuit board is a printed circuit board.

3. The ground terminal according to claim 1 wherein the width of said main body is larger than that of said tail part, and said ground terminal is tapered from said main body to said tail part.

4. The ground terminal according to claim 1 wherein said hooking element is a single-sided hook.

5. The ground terminal according to claim 1 wherein said hooking element is a double-sided hook.

6. The ground terminal according to claim 1 wherein said hooking element is extended downwardly from an end of said tail part.

7. The ground terminal according to claim 1 wherein said tail part is integrally formed with said main body.

8. The ground terminal according to claim 1 wherein said insertion part further comprises at least a lateral plate, which is sustained against a sidewall of said through-hole.

9. The ground terminal according to claim 1 wherein said main body is arranged on an upper surface of the circuit board.

10. The ground terminal according to claim 1 wherein said opening of said main body of said ground terminal is aligned with said perforation of said circuit board, and a fastening element is penetrated through said opening of said main body and said perforation of said circuit board.

11. The ground terminal according to claim 10 wherein said fastening element is a screw.

12. The ground terminal according to claim 10 wherein said coupling part is embedded into said perforation of said circuit board.

13. The ground terminal according to claim 12 wherein said coupling part is integrally formed with said main body.

* * * * *